US010763130B2

(12) United States Patent
Laevohan et al.

(10) Patent No.: US 10,763,130 B2
(45) Date of Patent: Sep. 1, 2020

(54) SYSTEMS AND METHODS FOR IMPROVED DELAMINATION CHARACTERISTICS IN A SEMICONDUCTOR PACKAGE

(71) Applicant: Microchip Technology Incorporated, Chandler, AZ (US)

(72) Inventors: Taweesak Laevohan, Chacoengsao (TH); Philbert Reyes, Bangkok (TH); Jaggrit Vilairat, Chacoengsao (TH); Sutee Thanaisawn, Chacoengsao (TH); Janpen Phimphuang, Chacoengsao (TH); Somsak Chunpangam, Chacoengsao (TH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/959,658

(22) Filed: Apr. 23, 2018

(65) Prior Publication Data

US 2018/0308713 A1 Oct. 25, 2018

Related U.S. Application Data

(60) Provisional application No. 62/489,869, filed on Apr. 25, 2017.

(51) Int. Cl.
*H01L 21/56* (2006.01)
*H01L 23/495* (2006.01)
(Continued)

(52) U.S. Cl.
CPC .......... *H01L 21/56* (2013.01); *H01L 23/4951* (2013.01); *H01L 23/4952* (2013.01);
(Continued)

(58) Field of Classification Search
None
See application file for complete search history.

(56) References Cited

U.S. PATENT DOCUMENTS

| 6,110,805 A | 8/2000 | Schrock et al. ............... 438/455 |
| 6,223,800 B1 | 5/2001 | Kim et al. ..................... 156/556 |

(Continued)

FOREIGN PATENT DOCUMENTS

EP 2387067 A1 11/2011 ............. C08G 59/62

OTHER PUBLICATIONS

International Search Report and Written Opinion, Application No. PCT/US2018/029259, 14 pages, dated Jul. 30, 2018.

*Primary Examiner* — Bo B Jang
(74) *Attorney, Agent, or Firm* — Slayden Grubert Beard PLLC (57) ABSTRACT

Systems and methods are provided for producing an integrated circuit package, e.g., an SOIC package, having reduced or eliminated lead delamination caused by epoxy outgassing resulting from the die attach process in which an integrated circuit die is attached to a lead frame by an epoxy. The epoxy outgassing may be reduced by heating the epoxy during or otherwise in association with the die attach process, e.g. using a heating device provided at the die attach unit. Heating the epoxy may achieve additional cross-linking in the epoxy reaction, which may thereby reduce outgassing from the epoxy, which may in turn reduce or eliminate subsequent lead delamination. A heating device located at or near the die attach site may be used to heat the epoxy to a temperature of 55° C.±5° C. during or otherwise in association with the die attach process.

18 Claims, 4 Drawing Sheets

(51) Int. Cl.
*H01L 23/00* (2006.01)
*G01R 31/28* (2006.01)

(52) U.S. Cl.
CPC .. *H01L 23/49513* (2013.01); *H01L 23/49541* (2013.01); *H01L 24/03* (2013.01); *H01L 24/08* (2013.01); *H01L 24/48* (2013.01); *H01L 24/75* (2013.01); *H01L 24/83* (2013.01); *H01L 24/85* (2013.01); *G01R 31/2855* (2013.01); *H01L 24/29* (2013.01); *H01L 24/32* (2013.01); *H01L 24/743* (2013.01); *H01L 2224/2731* (2013.01); *H01L 2224/2919* (2013.01); *H01L 2224/32013* (2013.01); *H01L 2224/32245* (2013.01); *H01L 2224/45147* (2013.01); *H01L 2224/4889* (2013.01); *H01L 2224/48247* (2013.01); *H01L 2224/48511* (2013.01); *H01L 2224/73265* (2013.01); *H01L 2224/7525* (2013.01); *H01L 2224/75251* (2013.01); *H01L 2224/75283* (2013.01); *H01L 2224/75611* (2013.01); *H01L 2224/75651* (2013.01); *H01L 2224/83048* (2013.01); *H01L 2224/83097* (2013.01); *H01L 2224/83192* (2013.01); *H01L 2224/83194* (2013.01); *H01L 2224/83855* (2013.01); *H01L 2224/83948* (2013.01); *H01L 2224/92247* (2013.01); *H01L 2924/14* (2013.01); *H01L 2924/181* (2013.01); *H01L 2924/35121* (2013.01); *H01L 2924/3641* (2013.01)

(56) References Cited

U.S. PATENT DOCUMENTS

| | | | |
|---|---|---|---|
| 6,960,491 B2 | 11/2005 | Lin et al. | 438/108 |
| 2002/0117743 A1* | 8/2002 | Nakatani | H01L 21/4857 257/687 |
| 2012/0040499 A1* | 2/2012 | Nomura | C08G 59/621 438/124 |

* cited by examiner

SYSTEMS AND METHODS FOR IMPROVED DELAMINATION CHARACTERISTICS IN A SEMICONDUCTOR PACKAGE

RELATED PATENT APPLICATION

This application claims priority to commonly owned U.S. Provisional Patent Application No. 62/489,869 filed Apr. 25, 2017, which is hereby incorporated by reference in its entirety for all purposes.

TECHNICAL FIELD

The present disclosure relates to semiconductor manufacturing, e.g., to systems and methods for providing improved delamination characteristics in a semiconductor package (e.g., providing reduced or eliminated delamination of a lead frame lead and/or DAP region) by reducing epoxy outgassing during the die attach process.

BACKGROUND

Many conventional integrated circuit ("IC") packages suffer from delamination after exposure to certain environmental conditions for an amount of time. For example, many IC packages experience delamination after the moisture loading requirement of 85° C. & 85% humidity for a duration of 168 hours, as specified by JEDEC MSL ("Moisture Sensitivity Level") testing. As used herein, "delamination" may refer to a separation between areas of the lead frame (which may be silver plated, in some devices) and an adjacent structure or material (e.g., mold compound or die/IC chip), which may result from poor adhesion between the lead frame and the adjacent structure or material, for example. Delamination may affect the IC packaging, resulting in package and wire bond weaknesses during reliability testing, such as when stress is applied to the package, e.g., due to moisture, temperature or humidity. Delamination may also result in product field failures such as broken or lifted wire bonds.

Thus, there is a need for reducing or eliminating lead frame delamination in IC packages, e.g., SOIC (Small Outline Integrated Circuit) packages. As an example only, there is a need for reducing or eliminating lead frame delamination, e.g., inner lead delamination, in 8-lead SOIC (SOIC-8) and 28-lead SOIC (SOIC-28) semiconductor device housings. The JEDEC requirement (JEDEC J-STD-020E) mandates zero delamination on wire bonding areas using palladium coated copper wire at MSL 1, which rating indicates that the devices is not moisture sensitive. Components must be mounted and reflowed within the allowable period of time (floor life out of the bag). One way to reduce or eliminate the leadfinger delamination is to downgrade the devices to MSL3, which rating defines a maximum of one week exposure to ambient conditions before the device is assembled on a PCB. However, this typically adds substantial cost to the parts and requires special handling of the parts by the customer when removing the parts from moisture barrier bags.

SUMMARY

Many IC packages, such as SOIC (Small Outline Integrated Circuit) packages for example, suffer from lead frame delamination, e.g., inner lead delamination, during package qualification testing. The inventors have determined that a significant cause of such lead delamination is epoxy outgassing resulting from the die attach process, in which an epoxy is deposited on the lead frame pad and the IC die is mounted on the epoxy-covered area of the lead frame pad to thereby secure the die to the lead frame.

The present invention provides systems and methods that reduce or eliminate lead delamination caused by epoxy outgassing resulting from the die attach process. In some embodiments, SOIC packages produced using such systems and/or methods may qualify to CuPdAu wire with zero lead delamination. This may provide increased cost savings and produce high quality products using CuPdAu wire.

In some embodiments, the epoxy outgassing is reduced by heating the epoxy during or otherwise in association with the die attach process, e.g. using a heating device provided at the die attach unit. Heating the epoxy may achieve additional cross-linking in the epoxy reaction, which may thereby reduce outgassing from the epoxy, which may in turn reduce or eliminate subsequent lead delamination. In some embodiments, a heating device is used to heat the epoxy to a temperature of 55° C.±5° C. during or otherwise in association with the die attach process.

One embodiment provides a method for manufacturing an integrated circuit device including an integrated circuit chip mounted on a die support area of a lead frame, wherein the method includes (a) performing a die attach process to form an integrated circuit structure, the die attach including depositing epoxy on at least a portion of the die support area of the lead frame, mounting the integrated circuit chip over the epoxy-covered die support area such that a portion of the epoxy extends laterally outside of an outer perimeter of the integrated circuit chip, and using a heating device to apply heat during the mounting step; (b) after the die attach process, performing a die attach cure process on the integrated circuit structure; (c) performing a wire bond process to bond at least one wire to the integrated circuit structure; and (d) applying a molding material to at least partially encapsulate the integrated circuit structure.

In one embodiment, the heating step comprises heating the epoxy to achieve additional cross-linking in the epoxy reaction and reduce outgassing from the epoxy as compared with an integrated circuit device produced according to a similar production processes but without the die attach heating step.

In one embodiment, the heating step is configured reduce a measure of outgassing from the epoxy by a factor of at least three as compared with an integrated circuit device produced according to a similar production processes but without the die attach heating step.

In some embodiments, the heating step comprises using the heating device to heat the epoxy to a temperature of 55° C.±15° C. In some embodiments, the heating step comprises using the heating device to heat the epoxy to a temperature of 55° C.±10° C. In some embodiments, the heating step comprises using the heating device to heat the epoxy to a temperature of 55° C.±5° C. In some embodiments, the heating step comprises using the heating device to heat the epoxy to a temperature of about 55° C.

In one embodiment, the die attach process includes: using a feeding device to carry the lead frame to an epoxy dispensing station; at the epoxy dispensing station, depositing the epoxy on the die support area of the lead frame; using the feeding device to carry the lead frame with deposited epoxy to a chip mounting station, the chip mounting station having an associated heater; and at the chip mounting station: mounting the integrated circuit chip over the epoxy-covered die support area, and using the heater to apply heat to at least the epoxy to achieve additional cross-linking in the epoxy reaction and reduce outgassing from the epoxy.

Another embodiment provides a system for manufacturing an integrated circuit device, the system including a loading unit configured to position a lead frame on a machine feeder, the lead frame including a die support area and a plurality of leads; the machine feeder configured to deliver the lead frame to an epoxy dispensing unit and to a die attach unit; wherein the epoxy dispensing unit is configured to deposit epoxy on at least a portion of the die support area of the lead frame; and wherein the die attach unit includes a mounting unit configured to mount the integrated circuit chip over the epoxy-covered die support area, and a die attach heating unit configured to apply heat to at least the epoxy to achieve additional cross-linking in the epoxy reaction and reduce outgassing from the epoxy.

In one embodiment, the die attach heating unit is configured to reduce outgassing from the epoxy as compared with an integrated circuit device produced without heating the epoxy in association with the die attach.

In one embodiment, the die attach heating unit is configured to reduce a measure of outgassing from the epoxy by a factor of at least three as compared with an integrated circuit device produced without heating the epoxy in association with the die attach.

In one embodiment, the die attach heating unit is configured to heat the epoxy to a temperature of about 55° C.

In one embodiment, the die attach heating unit is configured to heat the epoxy to a temperature of 55° C.±10° C.

In one embodiment, the die attach heating unit is configured to heat the epoxy to a temperature of 55° C.±5° C.

BRIEF DESCRIPTION OF THE FIGURES

Example aspects of the present disclosure are described below in conjunction with the figures, in which.

DESCRIPTION

Figure 1:
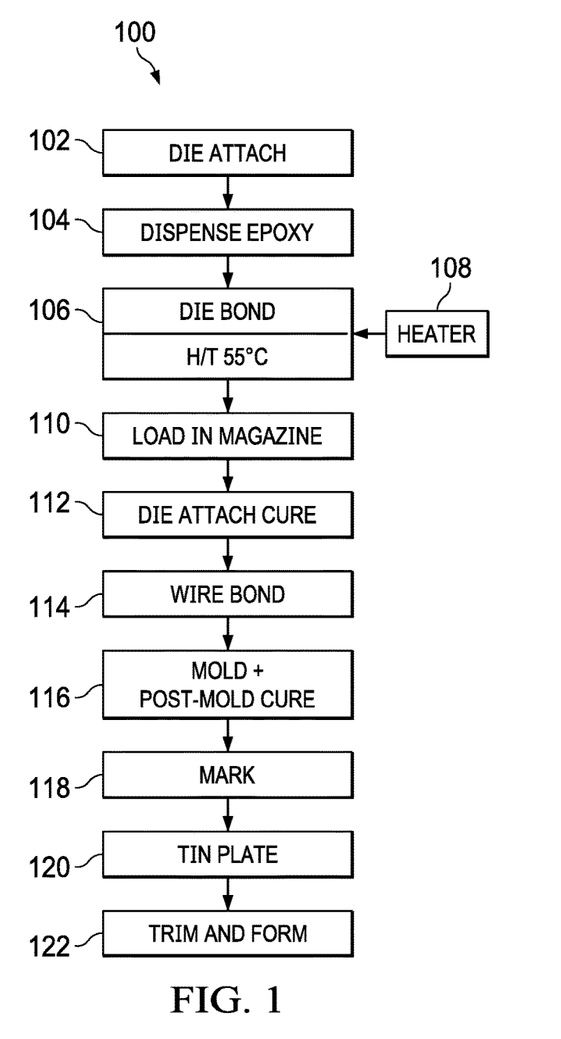
FIG. 1 illustrates an example assembly process for producing an integrated circuit (IC) device/package having improved lead delamination characteristics (e.g., reduced or eliminated lead delamination), according to one example embodiment.

FIG. 1 illustrates an example assembly process 100 for producing an integrated circuit (IC) device/package having improved lead delamination characteristics (e.g., reduced or eliminated lead delamination), according to one example embodiment. The lead delamination characteristics of the resulting IC package may be improved by adding a heating step to the die attach (D/A) process. At 102, a die attach (D/A) process is performed to attach an integrated circuit die (e.g., chip) to a lead frame. A lead frame may be loaded onto a machine feeder, e.g., a moving belt or track, and delivered to an epoxy dispensing unit. At 104, the epoxy dispensing unit may deposit epoxy on at least a portion of an upper surface of a lead frame, e.g., on a portion of a lead frame pad configured to receive the IC die.

The machine feeder may then deliver the epoxy-covered lead frame to a die bond unit, which may include a die mounting device and a heating device. At 106, the die mounting device mounts the die onto the epoxy-covered area of the lead frame pad, and a heating device 108 heats the region of the epoxy to achieve additional cross-linking in the epoxy reaction, which may thereby reduce outgassing from the epoxy, which may in turn reduce or eliminate lead delamination from the produced IC package. The heating device 108 may operate before, during, and/or after the mounting of the IC chip to the epoxy-covered lead frame pad. In some embodiments, the heating device 108 may heat the epoxy to a temperature of about 55° C., or 55° C.±10° C., or 55° C.±5° C. during or otherwise in association with the die attach process at 106.

At 110, the lead frame and IC chip structure may then be loaded into a magazine by a loading device, to complete the die attach process. A die attach cure may then be performed on the structure at 112, using any known techniques. A wire bond process may then be performed at 114, e.g., to connect the IC chip to one or more lead frame leads adjacent the lead frame pad. In some embodiments, CuPdAu bond wire may be used. A mold compound may then be applied to the IC structure at 116, e.g., to at least partially encapsulate the structure, and a post mold cure (PMC) process may be performed, using any known techniques. The IC structure, which may include any number of lead frames and IC chips mounted thereon, may then be marked at 118 and cut at 120-112 to provide a plurality of discrete IC packages.

Figure 2:
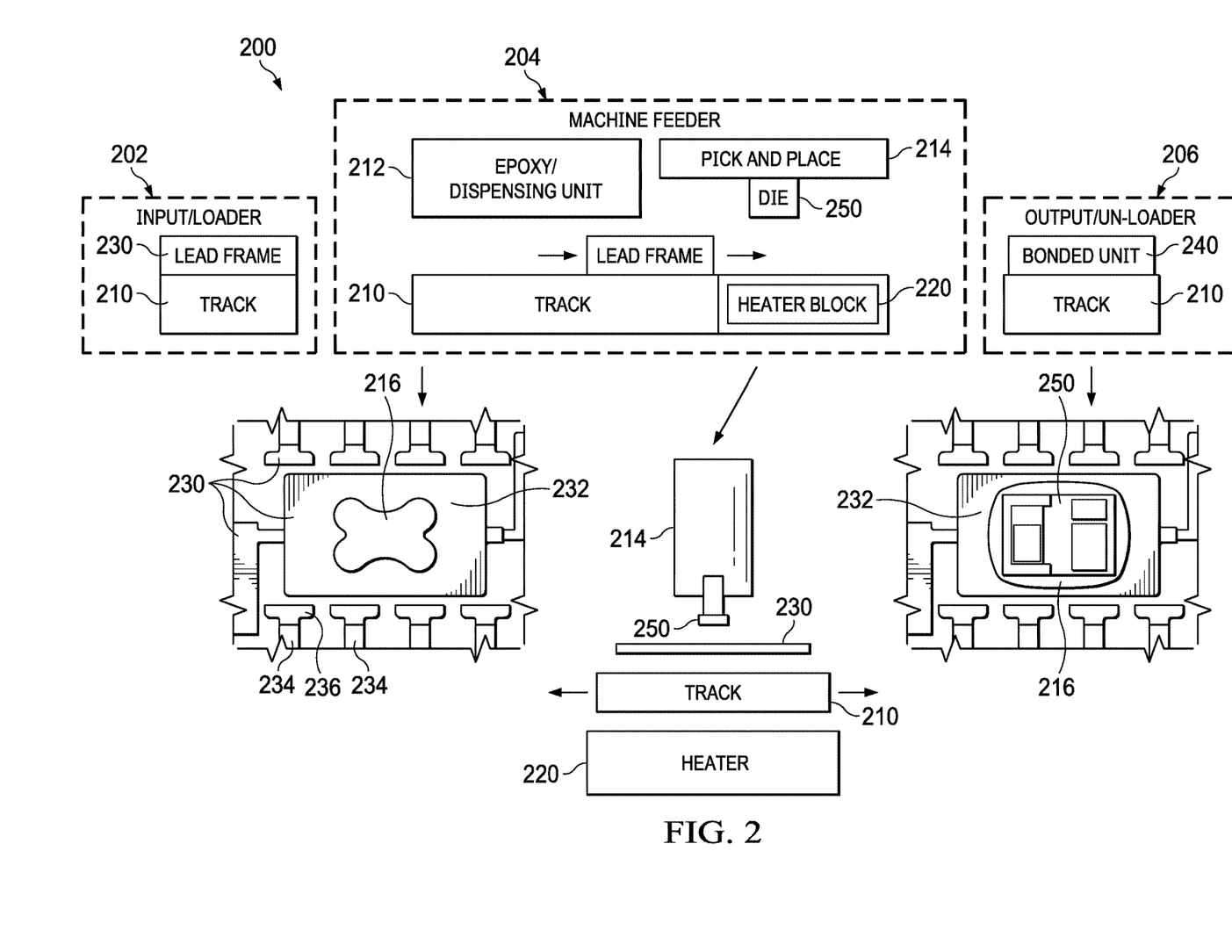
FIG. 2 illustrates an example system for facilitating a heated die attach process, e.g., using the example process shown in FIG. 1, according to one embodiment.

FIG. 2 illustrates an example system 100 for facilitating a heated die attach process, e.g., using method 100 discussed above, according to one embodiment. System 100 may include an input/loader 202, a machine feeder 204, and an output/unloader 206. Input/loader 202 may be configured to load a lead frame 230 onto an automated conveyor or track 210, which may carry the lead frame 230 to the machine feeder 204. Lead frame 230 may include a die pad 232 and a plurality of lead fingers 234. In some embodiments, a top surface of each lead finger 234, e.g., a tip region 236 or other region(s) of each lead finger 234, may be silver-coated and/or physically roughened by a roughening process, e.g., to increase a bonding between a subsequently deposited molding compound and the lead frame 230.

Machine feeder 204 may include an epoxy dispensing device 212 and a pick-and-place device 214. Epoxy dispensing device 212 may dispense an epoxy 216 onto the lead frame pad 232. The lead frame 230 may then be advanced to the pick-and-place device 214, which may pick and place an integrated circuit (IC) chip or die 250 onto the epoxy-covered portion of the lead frame pad 232, to thereby bond the IC die 250 the pad 232.

A heater 220 may be provided at or near the location of this die bond process, e.g., embodied integral with or separate from the pick-and-place device 214. Heater 220 may be configured to heat the epoxy 216 before, during, and/or after the mounting of the IC die 250 to the epoxy-covered lead frame pad 232 by pick-and-place device 214, to improve the epoxy-based die attach bond. For example, the heated die bond may achieve additional cross-linking in the epoxy reaction, which may thereby reduce outgassing from the epoxy, which may in turn reduce or eliminate lead delamination from the produced IC package. Heater 22 may heat the epoxy 216 to any suitable temperature to improve one or more characteristics of the epoxy bond. For example, in some embodiments, heater 22 may heat the epoxy 216 to a temperature of about 55° C.; or 55° C.±15° C.; or 55° C.±10° C.; or 55° C.±5° C. during or otherwise in association with the die attach process.

Heater 220 may include any system or device suitable for directly or indirectly heating the epoxy 216 on the lead frame die pad 232, e.g., a convective heater, a radiant heater, a heating cable, a forced air heater, or a conductive heater physically coupled to the lead frame 230 (e.g., at die pad 232). Heater 220 may be powered by electricity, natural gas, propane, solar energy, or any other energy source.

After the heated die attach process, the lead frame 230 with the attached and epoxy-bonded IC chip 250, indicated as bonded unit 240, may be advanced on track 210 to an output/unloading device 206, which may unload the bonded unit 240 for further processing, e.g., encapsulation by a mold compound.

Figure 3:
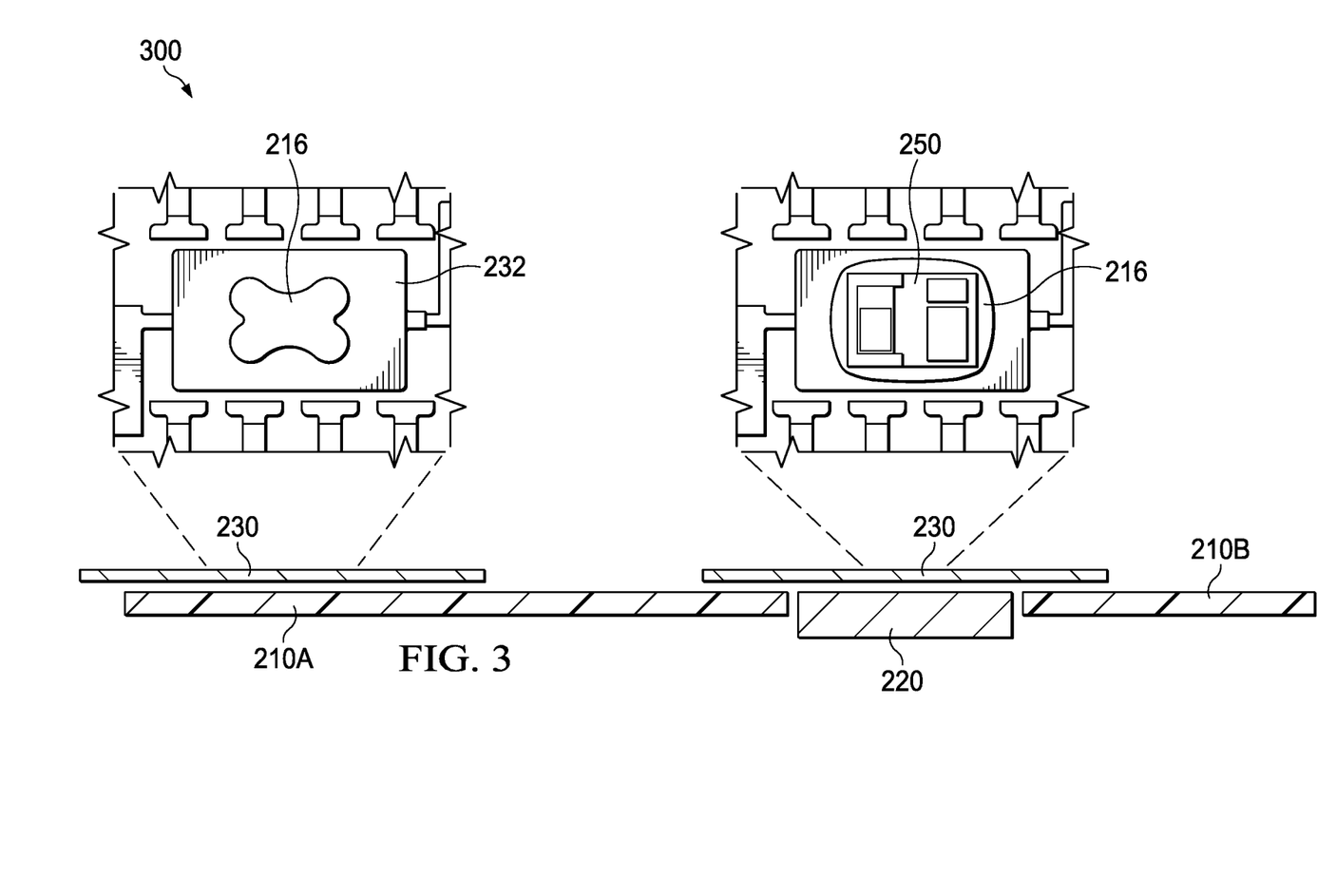
FIG. 3 illustrates an example embodiment of a lead frame advancing through an epoxy dispensing device followed by a pick-and-place device having an associated heater for providing a heated die bonding process, according to one embodiment.

FIG. 3 illustrates an example embodiment of lead frame 230 advancing through epoxy dispensing device 212 followed by pick-and-place device 214 having an associated heater 220 for providing a heated die bonding process, e.g., to heat the epoxy 216 before, during, and/or after the mounting of IC chip 250 to the lead frame pad 232. In the example embodiment shown in FIG. 3, heater 220 is located at the die bond site. For example, heater 22 may be arranged at an opening between sections 210A and 210B of track 210 that carries and advances lead frame 230 through the die attach system. Track section 210A may advance lead frame 230 through epoxy dispensing device 212, where a mass of epoxy 216 is deposited onto the lead frame pad 232, and then to a location at which lead frame pad 232 is aligned over heater 220, as shown in FIG. 3. At this location, heater 220 may heat the epoxy 216 (e.g., to a temperature of about 55° C.; or 55° C.±15° C.; or 55° C.±10° C.; or 55° C.±5° C.) and pick-and-place device 214 may mount the IC chip 250 onto the epoxy-covered region of the lead frame pad 232. Heater 220 may be controlled (e.g., automatically or manually) to heat the epoxy 216 before, during, and/or after the IC die 250 is physically mounted to the lead frame pad 232 by pick-and-place device 214.

In other embodiments, heater 220 may be arranged below a continuous section of track 210, and at the die bond site. In other embodiments, heater 220 may be arranged above the lead frame 230. For example, heater 220 may be arranged above and laterally offset from lead frame pad 232, to provide room for pick-and-place device 214 to mount the die 250 to pad 232.

In other embodiments, heater 220 may be arranged upstream of the bond site. For example, heater 220 may be located above, below, or integrated in the track 210 at a location upstream of the bond site. Track 210 may advance lead frame pad 232 to a location directly above or below the heater 220, where heater 220 may be operated to heat the epoxy 216 to a target temperature. Track 210 may then advance the lead frame with heated epoxy 216 to the bond site, wherein pick-and-place device 214 may then mount the die 250 onto the heated epoxy 216 on pad 232.

Figure 4:
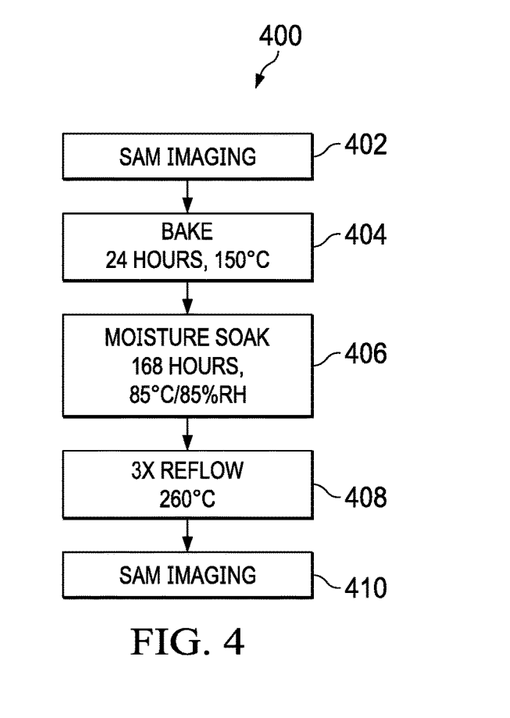
FIG. 4 illustrates an example reliability test flow for example lots of IC packages formed using systems and methods disclosed herein (including heating the die attach epoxy before, during and/or after the die attach), according to one embodiment.

FIG. 4 illustrates an example reliability test flow 400 for example lots of IC packages formed using systems and methods disclosed herein, e.g., including heating the die attach epoxy before, during and/or after the die attach. At 402, scanning acoustic imaging (SAM) of a lot of IC packages is performed. At 404, the lot is baked for 24 hours at 150° C. At 406, a moisture soak is performed on the lot, for 168 hours at 85° C. and 85% relative humidity. At 408, the lot is subjected to 3x reflow at 260° C. The lot is then imaged by SAM and inspected for delamination or other defects.

Table 1 shows relevant parameters for example lots of IC packages formed using systems and methods disclosed herein and tested according to process 400 shown in FIG. 4.

TABLE 1

Parameters regarding tested IC packages

| Die Information | |
|---|---|
| Wafer tech. | 200K |
| Die size | 60.50 × 89.20 mils |
| Die thickness | 15 mils |
| BPO | 82 μm |
| Die to DAP (die attach pad) ratio | 35.95% (for 95 × 158 mils pad) 43.69 (for 95 × 130 mils pad) |
| BOM Information | |
| Lead frame | Ag ring + BOT |
| Epoxy | 8390A |
| Wire | CuPdAu, 0.8 mils |
| Compound | G600V |

Table 2 shows testing results of six lots of IC packages characterized by the information in Table 1 and tested according to process 400 shown in FIG. 4. As shown, all lots showed no delamination after the test flow process.

TABLE 2

IC package test results

| Lot # | Package | LF pad size | Cure type | Wafer tech | Top dap | Top lead | Result |
|---|---|---|---|---|---|---|---|
| 1 | 8L SOIC | 95 × 130 | Oven | 200K | 0/45 | 0/45 | No delamination |
| 2 | 8L SOIC | 95 × 158 | Oven | 200K | 0/45 | 0/45 | No delamination |
| 3 | 8L SOIC | 95 × 158 (low Ag thk) | Oven | 200K | 0/45 | 0/45 | No delamination |
| 4 | 8L SOIC | 95 × 130 | Snap | 200K | 0/45 | 0/45 | No delamination |
| 5 | 8L SOIC | 95 × 158 | Snap | 200K | 0/45 | 0/45 | No delamination |
| 6 | 8L SOIC | 95 × 158 (low Ag thk) | Snap | 200K | 0/45 | 0/45 | No delamination |

Figure 5A:
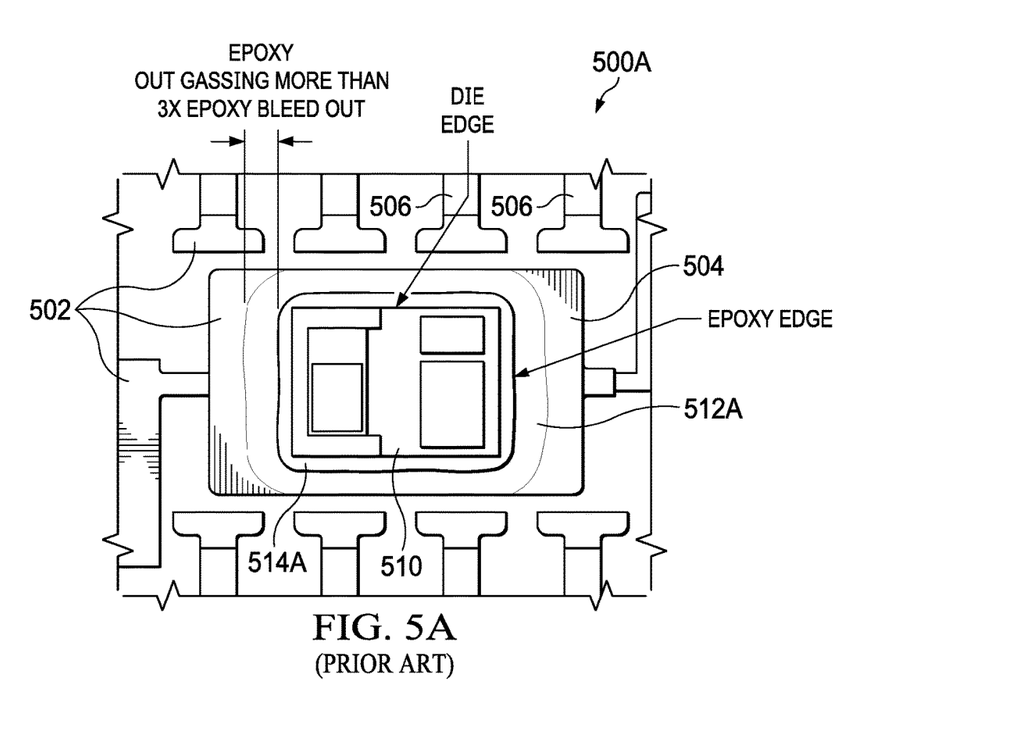
FIGS. 5A and 5B illustrate differences between an example IC package formed according to conventional techniques (FIG. 5A) and an example IC package formed using systems and methods disclosed herein (FIG. 5B), e.g., including heating the die attach epoxy before, during and/or after the die attach.
Figure 5B:
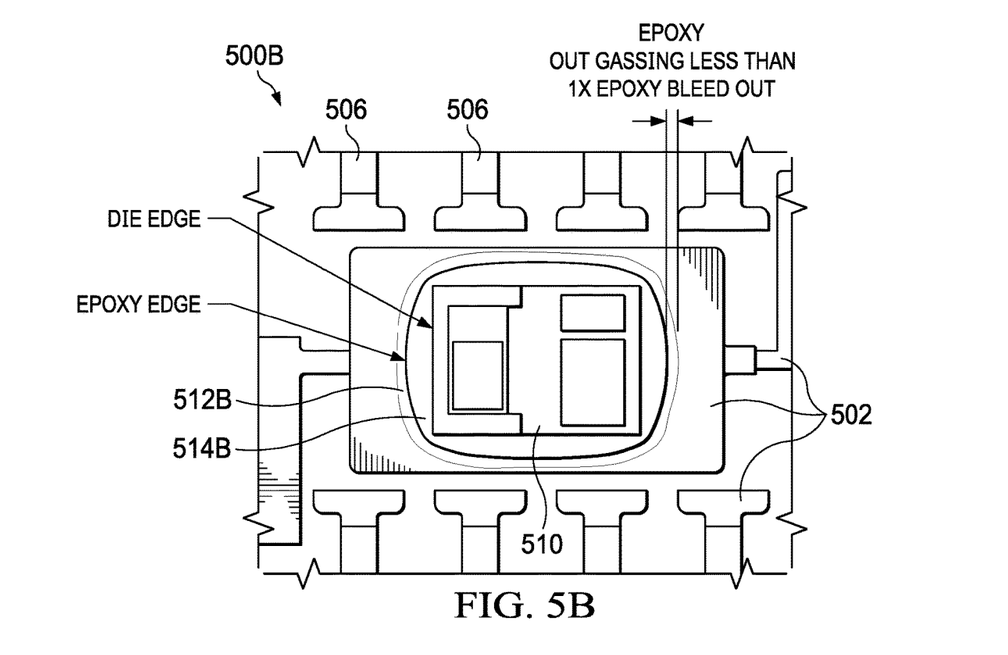

FIGS. 5A and 5B illustrate differences between an example IC package 500A formed according to conventional techniques (FIG. 5A) and an example IC package 500B formed using systems and methods disclosed herein (FIG.

5B), e.g., including heating the die attach epoxy before, during and/or after the die attach. Each example IC package 500A, 500B includes a lead frame 502 including a die pad 504 and lead fingers 506, and an IC die/chip 510 mounted to the lead frame pad 504 by an epoxy 514A, 514B. As shown in FIG. 5A, in the conventional IC package 500A, the average distance of epoxy outgassing 512A (beyond the outer edge of the epoxy 514A) may be about or greater than 3× the average distance of epoxy bleed out. In contrast, as shown in FIG. 5B, in the example IC package 500B according to the present invention, the average distance of epoxy outgassing 512B (beyond the outer edge of the epoxy 514B) may be less than 1× the average distance of epoxy bleed out.

Although the disclosed embodiments are described in detail in the present disclosure, it should be understood that various changes, substitutions and alterations can be made to the embodiments without departing from their spirit and scope.

What is claimed is:

1. A method for manufacturing an integrated circuit device including an integrated circuit chip mounted on a die support area of a lead frame, the method comprising:
    performing, by an automated die attach machine, an automated die attach process to form an integrated circuit structure, the automated die attach process including:
        depositing epoxy, by an automated epoxy dispensing machine of the automated die attach machine, on at least a portion of the die support area of the lead frame; and
        using an automated heater associated with an automated chip mounting device to heat the epoxy on the die support area of the lead frame to a temperature of 55° C.±15° C. and while the epoxy is at the heated temperature of 55° C.±15° C., using the automated chip mounting device of the automated die attach machine to mount the integrated circuit chip over the epoxy-covered die support area such that a portion of the epoxy extends laterally outside of an outer perimeter of the integrated circuit chip, wherein the heating of the epoxy to the heated temperature of 55° C.±15 achieves additional cross-linking in an epoxy reaction and reduces outgassing from the epoxy, in comparison to performing the automated mounting step without heating the epoxy to the temperature of 55° C.±15° C.;
    after the die attach process, performing a die attach cure process on the integrated circuit structure;
    performing a wire bond process to bond at least one wire to the integrated circuit structure; and
applying a molding material to at least partially encapsulate the integrated circuit structure.

2. The method of claim 1, wherein the automated heating step is configured to reduce a measure of outgassing from the epoxy by a factor of at least three, in comparison to performing the automated mounting step without heating the epoxy to the temperature of 55° C.±15° C.

3. The method of claim 1, wherein the automated heating step comprises using the automated heater to heat the epoxy to a temperature of about 55° C.

4. The method of claim 1, wherein the automated heating step comprises using the automated heater to heat the epoxy to a temperature of 55° C.±10° C.

5. The method of claim 1, wherein the automated heating step comprises using the automated heater to heat the epoxy to a temperature of 55° C.±5° C.

6. The method of claim 1, wherein the automated die attach process includes:
    using an automated feeding device to carry the lead frame to the epoxy dispensing machine;
    depositing, by the epoxy dispensing machine, the epoxy on the at least portion of the die support area of the lead frame;
    using the automated feeding device to carry the lead frame with the deposited epoxy to the automated chip mounting device having the automated heater; and
    mounting, by the automated chip mounting device, the integrated circuit chip over the epoxy-covered die support area.

7. The method of claim 1, comprising:
    using an automated feeding device to carry the lead frame with the deposited epoxy to the automated chip mounting device;
    at the automated chip mounting device, simultaneously:
        operating the automated heater to heat the epoxy on the die support area of the lead frame to achieve the additional cross-linking in the epoxy reaction and the reduction of outgassing from the epoxy; and
        mounting the integrated circuit chip over the epoxy-covered die support area such that the portion of the epoxy extends laterally outside of the outer perimeter of the integrated circuit chip.

8. The method of claim 1, comprising:
    using an automated feeding device to carry the lead frame with the deposited epoxy to a chip mounting location;
    while the lead frame is located at the chip mounting location, both:
        operating the automated heater to heat the epoxy on the die support area of the lead frame to achieve the additional cross-linking in the epoxy reaction and the reduction of outgassing from the epoxy; and
        mounting, by the automated chip mounting device, the integrated circuit chip over the epoxy-covered die support area such that the portion of the epoxy extends laterally outside of the outer perimeter of the integrated circuit chip.

9. The method of claim 8, wherein the automated heater is located directly below the die support area of the lead frame at the chip mounting location, such that the automated heater applies heat directly underneath the epoxy on the die support area.

10. A system for manufacturing an integrated circuit device, the system comprising:
    an automated loading machine configured to position a lead frame on an automated machine feeder, the lead frame including a die support area and a plurality of leads;
    the automated machine feeder configured to deliver the lead frame to an automated epoxy dispensing machine and to an automated die attach machine;
    wherein the epoxy dispensing machine is configured to deposit epoxy on at least a portion of the die support area of the lead frame;
    wherein the die attach machine includes:
        an automated die attach heater configured to apply heat to at least the epoxy to a temperature of 55° C.±15° C. to achieve additional cross-linking in an epoxy reaction and reduce outgassing from the epoxy, in comparison to mounting the integrated circuit chip without heating the epoxy to the temperature of 55° C.±15° C.; and
        an automated mounting device configured to mount an integrated circuit chip over the epoxy-covered die support area while the epoxy is at the heated temperature of 55° C.±15° C.

11. The system of claim 10, wherein the automated die attach heater is configured to reduce a measure of outgassing from the epoxy by a factor of at least three, in comparison to mounting the integrated circuit chip without heating the epoxy to the temperature of 55° C.±15° C.

12. The system of claim 10, wherein the automated die attach heater is configured to heat the epoxy to a temperature of about 55° C.

13. The system of claim 10, wherein the automated die attach heater is configured to heat the epoxy to a temperature of 55° C.±10° C.

14. The system of claim 10, wherein the automated die attach heater is configured to heat the epoxy to a temperature of 55° C.±5° C.

15. The system of claim 10, wherein the automated die attach heater is located at the automated mounting device such that the automated heater is configured to apply heat to the epoxy on the die support area of the lead frame simultaneously with the mounting of the integrated circuit chip by the automated mounting device.

16. The system of claim 10, wherein:
the automated machine feeder is configured to deliver the lead frame with the deposited epoxy to a chip mounting location; and
while the lead frame is located at the chip mounting location:
the automated die attach heater is configured to apply heat to the epoxy on the die support area; and
the automated chip mounting device is configured to mount the integrated circuit chip over the epoxy-covered die support area.

17. The system of claim 16, wherein the automated die attach heater is located directly below the die support area of the lead frame at the chip mounting location, such that the automated die attach heater is configured to apply heat directly underneath the epoxy on the die support area.

18. A method for manufacturing an integrated circuit device including an integrated circuit chip mounted on a die support area of a lead frame, the method comprising:
performing, by an automated die attach machine, an automated die attach process to form an integrated circuit structure, the automated die attach process including:
using an automated feeding device to carry the lead frame to an automated epoxy dispensing machine;
depositing epoxy, by the automated epoxy dispensing machine, on at least a portion of the die support area of the lead frame;
using the automated feeding device to carry the lead frame with the deposited epoxy to an automated chip mounting device having an associated heater;
using the heater associated with the automated chip mounting device to heat the epoxy on the die support area of the lead frame to a temperature of 55° C.±15° C. and while the epoxy is at the heated temperature of 55° C.±15° C., using the automated chip mounting device of the automated die attach machine to mount the integrated circuit chip over the epoxy-covered die support area such that a portion of the epoxy extends laterally outside of an outer perimeter of the integrated circuit chip, wherein the heating of the epoxy to the heated temperature of 55° C.±15 achieves additional cross-linking in an epoxy reaction and reduces outgassing from the epoxy, in comparison to performing the automated mounting step without heating the epoxy to the temperature of 55° C.±15° C.;
after the die attach process, performing a die attach cure process on the integrated circuit structure;
performing a wire bond process to bond at least one wire to the integrated circuit structure; and
applying a molding material to at least partially encapsulate the integrated circuit structure.

* * * * *